United States Patent
McHenry et al.

[11] Patent Number: 5,672,388
[45] Date of Patent: Sep. 30, 1997

[54] MEMBRANE REPARATION AND POER SIZE REDUCTION USING INTERFACIAL OZONE ASSISTED CHEMICAL VAPOR DEPOSITION

[75] Inventors: James Alexander McHenry, Washington; Harry William Deckman, Clinton, both of N.J.; Edward William Corcoran, Jr., Easton, Pa.; Wenyih Frank Lai, Fair Lawn; Horst Witzke, Flemington, both of N.J.

[73] Assignee: Exxon Research & Engineering Company, Florham Park, N.J.

[21] Appl. No.: 272,360

[22] Filed: Jul. 8, 1994

[51] Int. Cl.⁶ .................................................. C23C 16/00
[52] U.S. Cl. ........................... 427/255.3; 427/255.1; 427/255.2; 427/248.1
[58] Field of Search ............... 427/248.1, 255.3, 427/255.2, 255.1

[56] References Cited

U.S. PATENT DOCUMENTS

| | | | |
|---|---|---|---|
| 3,244,643 | 4/1966 | Schwartz | 252/455 |
| 4,571,443 | 2/1986 | DiCosimo et al. | 585/428 |
| 4,631,267 | 12/1986 | Lachman et al. | 502/439 |
| 4,631,268 | 12/1986 | Lachman et al. | 502/439 |
| 4,631,269 | 12/1986 | Lachman et al. | 502/439 |
| 4,657,880 | 4/1987 | Lachman et al. | 502/64 |
| 4,699,892 | 10/1987 | Suzuki | 502/4 |
| 4,716,136 | 12/1987 | Weisz et al. | 502/64 |
| 4,800,187 | 1/1989 | Lachman et al. | 502/64 |
| 4,827,071 | 5/1989 | Hazbun | 585/443 |
| 4,845,054 | 7/1989 | Mitchener | 437/238 |
| 4,860,584 | 8/1989 | Mercer et al. | 73/336.5 |
| 4,876,890 | 10/1989 | Mercer et al. | 73/336.5 |
| 4,904,518 | 2/1990 | Mercer et al. | 428/195 |
| 4,925,459 | 5/1990 | Rojey et al. | 155/16 |
| 4,927,768 | 5/1990 | Coughlin et al. | 436/172 |
| 4,968,430 | 11/1990 | Hildenbrand et al. | 210/640 |
| 4,973,606 | 11/1990 | Sterzel et al. | 521/27 |
| 4,981,676 | 1/1991 | Minet et al. | 423/652 |
| 4,990,714 | 2/1991 | Nemet-Mavrodin | 585/407 |
| 5,019,263 | 5/1991 | Haag et al. | 210/500.25 |
| 5,100,596 | 3/1992 | Haag et al. | 264/42 |
| 5,110,478 | 5/1992 | Haag et al. | 210/650 |
| 5,143,614 | 9/1992 | Soria et al. | 210/321.61 |
| 5,248,643 | 9/1993 | Patil et al. | 502/67 |
| 5,258,339 | 11/1993 | Ma et al. | 502/4 |
| 5,260,242 | 11/1993 | Dunne et al. | 502/63 |
| 5,266,542 | 11/1993 | Hashimoto et al. | 502/64 |
| 5,290,736 | 3/1994 | Sato et al. | 437/238 |
| 5,354,715 | 10/1994 | Wang et al. | 437/238 |

FOREIGN PATENT DOCUMENTS

| | | |
|---|---|---|
| 1235684 | 4/1988 | Canada . |
| 2016960AA | 11/1990 | Canada . |
| 1040152 | 3/1990 | China . |
| 0135069A2 | 3/1985 | European Pat. Off. . |
| 0180200A2 | 5/1986 | European Pat. Off. . |

(List continued on next page.)

OTHER PUBLICATIONS

Synthesis and characterization of a pure zeolitic membrane, Tsikoyiannis and Haag, Zeolites, 1992, vol. 12, Feb., pp. 126–130.

*Primary Examiner*—Roy V. King
*Attorney, Agent, or Firm*—Estelle C. Bakun; Jay Simon

[57] ABSTRACT

The instant invention is directed toward a process for enhancing the permselective properties, selectively sealing defects and pinholes, controllably altering the pore size and stabilizing the permselective properties of articles having apperatures therein comprising the steps of: simultaneously contacting an article having a first and second surface, said first and second surfaces being capable of passing ozone and silicon compounds therethrough and said first and second surfaces being oriented such that said silicon compounds and ozone can react across said first and second surfaces, with ozone on said first surface and a silicon compound on said second surface and wherein said contacting is conducted for a time and at a temperature and pressure sufficient to allow said ozone and said silicon compound to form a silicon oxide.

9 Claims, 7 Drawing Sheets

FOREIGN PATENT DOCUMENTS

| | | |
|---|---|---|
| 0188182A1 | 7/1986 | European Pat. Off. . |
| 0228885A2 | 7/1987 | European Pat. Off. . |
| 0324675A1 | 7/1989 | European Pat. Off. . |
| 0336241A1 | 10/1989 | European Pat. Off. . |
| 0344011A1 | 11/1989 | European Pat. Off. . |
| 0398093A2 | 11/1990 | European Pat. Off. . |
| 0442410A1 | 8/1991 | European Pat. Off. . |
| 0460512A1 | 12/1991 | European Pat. Off. . |
| 0476363A1 | 3/1992 | European Pat. Off. . |
| 0481658A1 | 4/1992 | European Pat. Off. . |
| 0481659A1 | 4/1992 | European Pat. Off. . |
| 0481660A1 | 4/1992 | European Pat. Off. . |
| 0511739A1 | 11/1992 | European Pat. Off. . |
| 0536995A1 | 4/1993 | European Pat. Off. . |
| 0570842A1 | 11/1993 | European Pat. Off. . |
| 2079460 | 11/1971 | France . |
| 3827049 | 2/1990 | Germany . |
| 4029433 | 3/1992 | Germany . |
| 63-287504 | 11/1984 | Japan . |
| 6028826 | 3/1985 | Japan . |
| 60129119 | 7/1985 | Japan . |
| 3262523 | 11/1991 | Japan . |
| 2190397 | 11/1987 | United Kingdom . |
| WO9213631 | 8/1992 | WIPO . |
| WO9219574 | 11/1992 | WIPO . |
| WO9300155 | 1/1993 | WIPO . |
| WO9317781 | 9/1993 | WIPO . |
| WO9319840 | 10/1993 | WIPO . |
| WO9319841 | 10/1993 | WIPO . |
| WO9401209 | 1/1994 | WIPO . |
| WO9401365 | 1/1994 | WIPO . |

| | Materials | Layer Thickness | Pore Size |
|---|---|---|---|
| Premselective Layer | γ-Alumina | ~5μm; | ~40 A |
| Intermediate Layer | α-Alumina | .1mm; | ~.1μm |
| Large Pore Support Layer | α-Alumina | 5mm | ~.1μm |

MEMBRANE REPARATION AND POER SIZE REDUCTION USING INTERFACIAL OZONE ASSISTED CHEMICAL VAPOR DEPOSITION

FIELD OF INVENTION

The present invention is directed toward a method for reducing pore size and reparating defects in a porous substrate or an active membrane layer having voids or defects therein, using chemical vapor deposition.

BACKGROUND OF INVENTION

Reparation technologies apply coatings to membranes to repair existing defects or holes in membranes. Reparation techniques either selectively seal defects and holes or attenuate their effects with a permeable coating that covers the membrane surface. Reparation techniques which selectively seal defects are often based on the selective application of a film-forming material which acts as a diffusion barrier. Reparation technologies which attenuate rather than selectively seal defects or holes apply a permeable layer over the entire surface of the membrane. The mass transfer resistance of this layer must be sufficient to attenuate the effect of defects in the membrane and improve the permselective properties of the membrane. Reparation technologies improve the permselective properties of membranes with defects or holes. Defects and holes form nonselective permeation pathways through the membrane and reparation decreases the flux through these nonselective pathways relative to permselective pathways through the rest of the membrane.

Coating materials which have been used to reparate polymer membranes have been generally polymer and epoxy materials. When they are used to reparate polymer membranes by selectively sealing defects, film forming polymers or epoxies are applied in a manner such that they are selectively absorbed into defects or holes. For example, hollow fiber membrane modules containing a small percentage of broken fibers have been reparated by selectively filling broken fibers with epoxy. When they are used to attenuate defects, permeable polymers or epoxies are applied as a thin film coating over the organic membrane surface. The polymer and epoxy materials used to seal and attenuate defects in polymer membranes tend to degrade in the harsh chemical environments and high temperature operations in which inorganic membranes can be used. In addition, many of these polymer and epoxy materials cannot be used to reparate zeolite membranes because they either plug the zeolite pores or fail to adhere to the zeolite surface.

For inorganic membranes high temperature coating technologies have been developed to alter the pore size of the membrane. An example of high temperature coating technology is given by G. R. Gavalas and C. E. Megiris in U.S. Pat. No. 4,902,307 where they describe the synthesis of an $SiO_2$ membrane on a porous support and method of use of the same. Properties of membranes coated in this manner are given by S. Woo Nam, and G. Gavalas in AICHE Syrup. Ser. 85(268) 68–74, 1989 where they describe the stability of $H_2$ permselective $SiO_2$ films formed by chemical vapor deposition. Additionally, M. Tspatsis, S. Kim, S. Woo Nam, and G. Gavalas, in I&EC Research (AICHE), 30, 1991 where they describe the synthesis of hydrogen permselective $SiO_2$, $TiO_2$, $Al_2O_3$, and $B_2O_3$ membranes from chloride precursors. The above coatings are applied at high temperatures in excess of about 500° C. which thermally stresses many inorganic membrane materials and precludes the use of many membrane module technologies. Chemical vapor deposition (CVD) processes have been extensively used in the semiconductor industry to deposit thin coatings used in integrated circuits and other microelectronic devices. Such CVD coating processes typically produced silica coatings from reaction of gaseous silicon containing molecules introduced from one side of the membrane and an oxidant which is brought from the other side. Unfortunately, silica coatings made in this way are dense coatings which can block the pore structure of a membrane evidenced by a negligible flux for hydrogen at temperatures below ~300°–400° C. This is the type of permselective transport which occurs in dense silica films. At high temperatures, hydrogen is transported through the interstices between atoms in the silica film, while at low temperatures the diffusivity through these sites becomes so low that the hydrogen flux drops dramatically. These high temperature CVD coatings are well suited to reducing the pore size of inorganic membranes below about 3 Å, however, they cannot be applied to reparate membrane materials or to selectively produce uniform pore sizes larger than about 3 Å. A further limitation of these high temperature coating techniques is that many membrane materials are destroyed by heating to the temperatures required for coating.

Problems with high temperature CVD coating techniques has caused the semiconductor industry to develop low temperature CVD coating techniques based on using ozone as an oxidant. Examples of the use of ozone assisted CVD for semiconductor applications are given by H. W. Fry, J. P. West, S. Poon B. A. Boeck and C. C. Yu in Solid State Technology (p.31, March 1992). Films produced by the semiconductor industry using low temperature ozone assisted CVD processes nevertheless still tend to be dense and impermeable. As such, to date, CVD processes based on ozone cannot be used to reparate membranes or to selectively alter the size of pores in membranes so that they are uniform and larger than about 3 Å. Developing such an ozone based reparation coating technology would be advantageous because it could be applied to a large number of membrane materials that cannot withstand high temperatures. Furthermore, many inorganic materials applied to membranes by low temperature ozone assisted CVD coating techniques could withstand harsh chemical environments.

SUMMARY OF THE INVENTION

Figure 1:
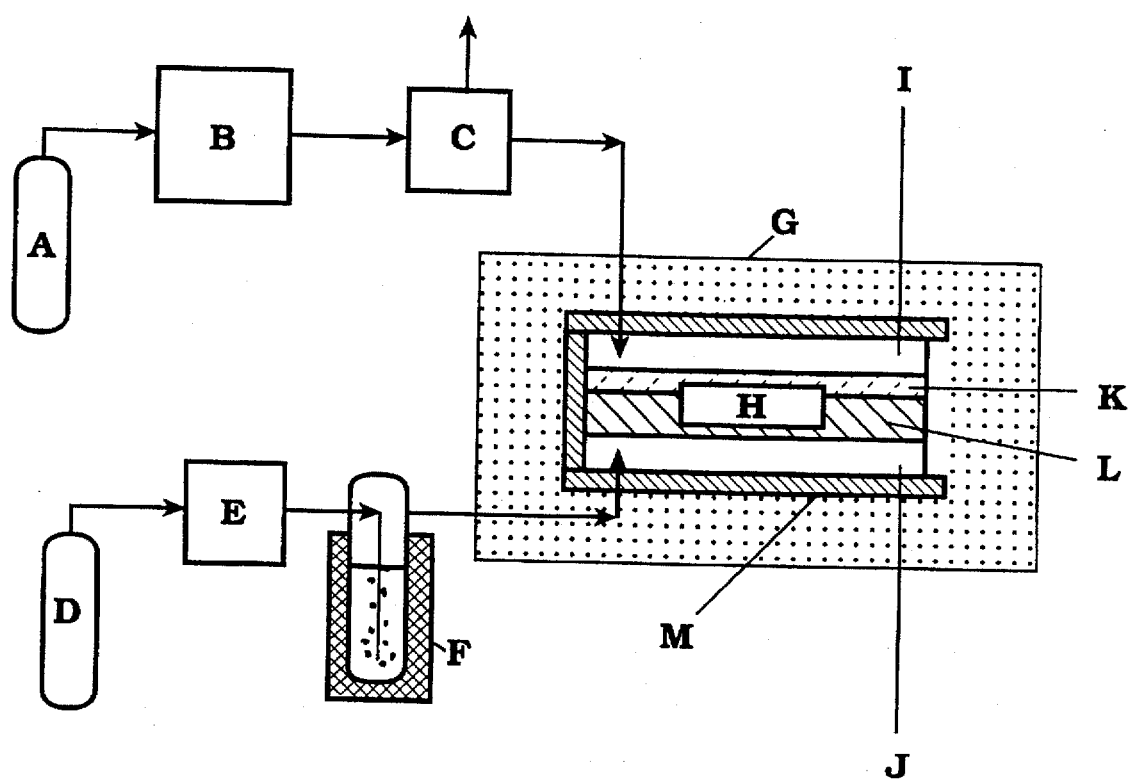
FIG. 1 is a schematic of the apparatus used to reparate the membranes of the examples. (A) is an air tank, (B) an ozone generator, (C) and (E) mass flow controls, (D) an argon tank, (F) a temperature controlled TMOS or TEOS Bubbler, and (G) a controlled temperature sandbath. (H) is the membrane, and (I) and (J) are vents for withdrawal of the ozone and volatile silicon containing gas. (K) is the zeolite layer, (L) is the porous substrate, and (M) is the membrane holder.

The instant invention is directed toward a process for enhancing the permselective properties, selectively sealing defects and pinholes, controllably altering the pore size and stabilizing the permselective properties of articles having apperatures therein comprising the steps of: simultaneously contacting an article having a first and second surface, said first and second surfaces being capable of passing ozone and silicon compounds therethrough and said first and second surfaces being oriented such that said silicon compounds and ozone can react across said first and second surfaces, with ozone on said first surface and a silicon compound on said second surface, and wherein said contacting is conducted for a time and at a temperature and pressure sufficient to allow said ozone and said silicon compound to form a silicon oxide. Apperature as used herein means any opening in the article acted upon, whether a void, defect, pore, pinhole, grain boundary zone space, etc.

DETAILED DESCRIPTION OF THE INVENTION

The present invention is a low temperature interfacial ozone assisted CVD (chemical vapor deposition) process which can be used to reparate defects in a membrane or to controllably alter the size of pores within a membrane. When it is used to reparate a membrane, it selectively reduces the mass transport through defects or holes in the membrane so that the membrane is capable of performing a desired separation. Membranes which are reparated using this technique do not have to be porous, however, when the invention is used to tailor the pore size of a membrane, some portion of the membrane structure must be porous. Besides reparating a membrane, the coating may also stabilize the membrane structure so that it retains its permselective properties during use. When it is used to tailor the pore size of a membrane, the coating applied by the interfacial ozone assisted CVD process selectively reduces the size of larger pores contained within the layer to be reparated. It is preferred that this layer be the layer that gives permselective properties to the membrane. The interfacial ozone assisted CVD process can also reduce the size of pores contained within this layer or another layer in the in the membrane structure. The reduction of the sizes of pores in the membrane is also considered to be a tailoring of the pore structure. The permselective properties of the membrane are improved whether the technique is used to reparate defects in membranes, or to tailor the pore size of a membrane. As such, the low temperature interfacial ozone assisted CVD process enhances the permselective properties of a membrane. When applied to zeolite membranes it not only repairs defects, but it also can stabilize the zeolite layer, preserving its permselective properties under operating conditions at temperatures from 50° to 750° C.

Inorganic membranes whose permselective properties can be enhanced in accordance with the instant procedure include zeolite membranes, ceramic ultrafiltration membranes, sol-gel membranes, metal membranes and combinations thereof. Polymer membranes whose permselective properties can be enhanced in accordance with the instant procedure include membranes with a dense nonporous layer, and polymer membranes with porous layers. When used with polymer membranes, the polymer membrane material must be stable at the temperatures used in the CVD deposition process and must not rapidly degrade when exposed to ozone. Rapid degradation would be a complete loss of membrane selectivity when exposed to ozone for longer than one hour.

The instant procedure improves permselective properties of membranes by forming a coating on said membranes produced by interfacial reaction between a reactive metal containing compound and ozone which is flowed over one side of the membrane. The ozone can be flowed over either face of the membrane, however if the membrane is asymmetrical, it is preferred to pass the ozone over the side of the membrane with the greater mass transfer resistance (smaller pore structure). The ozone is one part of a gas mixture, the rest of which does not significantly participate in the reaction. Concentration of ozone in the gas mixture can range from 0.05 to 50 % by volume and is preferably in the range between 1 and 15% by volume. Gases which are essentially inert under reaction conditions may form the rest of the gas mixture ie, air, nitrogen, argon, and oxygen. The coating produced by reaction with ozone is primarily an inorganic material and contains the silicon species from within the reactive silicon compound. In many cases the coating is an inorganic silicon oxide. In all cases reaction conditions are chosen so that ozone and the reactive silicon compound deposit a coating that enhances the permselective properties of the membrane.

The coating is deposited by introducing the ozone and reactive silicon compound so that they meet and react within or at the surface of the membrane. To obtain such an interfacial reaction, the ozone is introduced on one side of the membrane and the reactive silicon compound is introduced through the other side of the membrane or from material filling or coating the surface of the membrane. When the reactive silicon compound is introduced through the membrane, it is permeated through the membrane from the side opposite to that on which the ozone flows. In this case the reactive silicon compound can be flowed across the face of the membrane opposite to that on which the ozone flows. When the reactive silicon containing compound is introduced from the opposite side of the membrane while the ozone is flowing, it can be in either the gas or liquid phase. Gaseous reactive silicon containing compounds can be either true gasses or vapors. Liquid phase reactive silicon compounds that can be permeated from the opposite side of the membrane on which the ozone flows can be volatile or nonvolatile liquids. When the reactive silicon compound is introduced from within the membrane or from a film on its surface, it must be a nonvolatile liquid which is impregnated or coated onto the membrane before the ozone is introduced. To retain the compound in or on the membrane during the reaction, the vapor pressure at the reaction temperature must be less than 50 torr and more preferably less than 1 torr. In all events, the reactive silicon compound is not fed during the interfacial reaction from the same side of the membrane as the ozone.

Reactions between the reactive silicon compound and ozone are conducted at temperatures of <300° C. where the lifetime of ozone is longer than 10 milliseconds. Preferably the temperature will be <200° C. where the lifetime of ozone is longer than 1,000 milliseconds. The minimum temperature will be 20° C., preferably 100° C. Controlling the reaction temperature controls the rate of reaction of the ozone with the reactive silicon compound. Thus, controlling the rate of reaction affects the nature of the coating. For example with a porous membrane having defects, the extent to which the inorganic oxide coating can selectively seal defects and holes is determined by the relative rates of mass transport and reaction for ozone and the reactive silicon compound. A measure of these relative rates is the Thiele modulus which equals one when the relative rates of reaction and mass transport are equal and increases as the relative rate of reaction increases. Holes and defects are preferentially reparated when physical operating conditions are chosen so that the Thiele modulus is greater than 0.1 and preferably greater than one. For other types of membranes as well, the nature of the coating deposited by the interfacial ozone assisted CVD process is determined by the relative rate of reaction and mass transport. The rate of reaction can be controlled by not only the temperature, but also the ozone concentration, and the choice of reactive silicon compound. Methods to control the mass transport rate through the membrane can be a pressure gradient across the membrane, and controlling the concentration of the ozone or silicon containing reactant. Concentrations of ozone or the silicon containing reactant can be adjusted with a diluent. The diluent can be a material which does not participate in the reaction.

Reactive metal compounds usable with the present invention must react in the specified temperature range with ozone to form a solid coating. The reactive silicon compounds can be either in the gas or liquid phase depending on the way the interfacial reaction is conducted. When the reactive silicon containing compound is coated onto or impregnated into the membrane before exposing it to ozone, the compound must be a nonvolatile liquid. The liquid must be nonvolatile so that it does not transport away from the membrane by vaporization after being coated onto or impregnated into the membrane. To retain the compound in or on the membrane during the reaction, the vapor pressure at the reaction temperature of the liquid phase reactive silicon containing compound must be less than 50 torr and more preferably less than 1 torr. To impregnate it or coat it onto the surface of the membrane, the viscosity of the compound must be less that 1,000 centistokes. Examples of reactive silicon containing compounds meeting these requirements include silicone oils with molecular weights between 300 g/mole and 10,000 g/mole. When the reactive silicon compound is introduced from the opposite side of the membrane, the reactive silicon containing compound can be either a liquid or a gas which permeates through the membrane or defects in the membrane. Liquid phase compounds can be volatile materials such as organosilicon compounds like hexamethyldisilane (HMDS), tetramethoxysilane (TMOS) and tetraethoxysilane (TEOS) or nonvolatile liquids like silicone oil. Gaseous reactive silicon containing compounds can be either true gasses like silane or vapors produced by bubbling an inert gas through a volatile liquid phase reactive silicon containing compound. Vapors from the volatile silicon compound are carried with the inert gas which is then flowed over the membrane. Examples of inert gasses which can be used include argon and nitrogen. Volatile liquid compounds that can be used are selected from volatile organometallics such as boron hydrides, boron halides, or titanium chloride. Preferably, volatile organosilicon compounds such as hexamethyldisilane (HMDS), tetramethoxysilane (TMOS) and tetraethoxysilane (TEOS) will be used.

Conditions under which the interfacial ozone assisted CVD process is performed must be chosen so that the decomposition reaction leading ultimately to the reparation coating occurs primarily on the surface or within the membrane and does not occur homogeneously in the gas phase producing powders that rain onto the membrane. Optimum conditions are set by controlling the time temperature profile of molecules in the reaction zone. Usually good films are produced when the ozone flows rapidly across the substrate surface. The flow rate of the ozone should be such that the residence times for ozone molecules in the heated zones is less that the thermal ozone lifetime. The heated zones can include any preheating zone which may exist as well as the heated portion of the reaction zone. It is preferred that flow rate of the ozone should be such that the residence times for ozone molecules in the heated zones is less than one fourth that of the thermal ozone lifetime. Equivalently, the flow velocity of the gas stream containing the ozone should satisfy the following inequality:

$$\text{gas flow rate} > \frac{\text{gas volume in reaction cell} + \text{gas volume of preheat zone}}{\text{ozone lifetime at reaction temperature}}$$

When the procedure of the present invention is applied to a membrane where the transport of molecules throughout the membrane is controlled by a mesoporous layer, the procedure can reparate defects in the mesoporous layer as well as tailor the pore size of the mesoporous layer. Specifically, the present invention can be used to make the pores in the mesoporous layer more monodispersed. When the present invention is applied to microporous membranes it may not only reparate the membrane, but it may also stabilize the permselective properties of membranes which do not have defects. Stabilization of permselective properties is taken to mean preserving the permselective properties of the membrane under conditions in harsh chemical environments or at high temperatures. High temperatures is taken to mean temperatures above 100° C. All of these functions enhance the permselective properties of membranes. As such the present invention provides a method for enhancing the permselective properties of membranes. When the process is used with membranes having a pore structure, interfacial CVD coatings can be applied so that less than 50% of the pores in the membranes are blocked. A blocked pore is a pore through which molecular species permeating the membrane cannot flow or diffuse.

One application involves using the process of the current invention to improve the performance of current commercial surface microfiltration and ultrafiltration membranes. In this mode of application, the reparation technology would be applied to eliminate defects and pinholes in the modules, while at the same time altering the structure of all pores to decrease their size and make them more monodisperse. Another application of this reparation technology would be to produce gas separation membranes. With the current invention, it is possible to convert existing inorganic ultrafiltration membrane modules into gas separation membranes. This conversion could be done after the module has been assembled. Another application of the ozone assisted CVD reparation technology described in this memo is for the production of a zeolite membrane. Zeolite membranes have long been a goal of separation science. As synthesized zeolite membranes are often not highly selective. We have found that they can be made selective by applying coatings using the process of the current invention. The coating imparts selectivity to the as synthesized membranes which persists during use in separation applications. In this application, the coating serves to reparate defects in the assynthesized membranes, and also serves to stabilize the permselective properties of assynthesized zeolite membranes which do not have defects.

The following examples are for illustration and not limiting.

EXAMPLES

Figure 2:
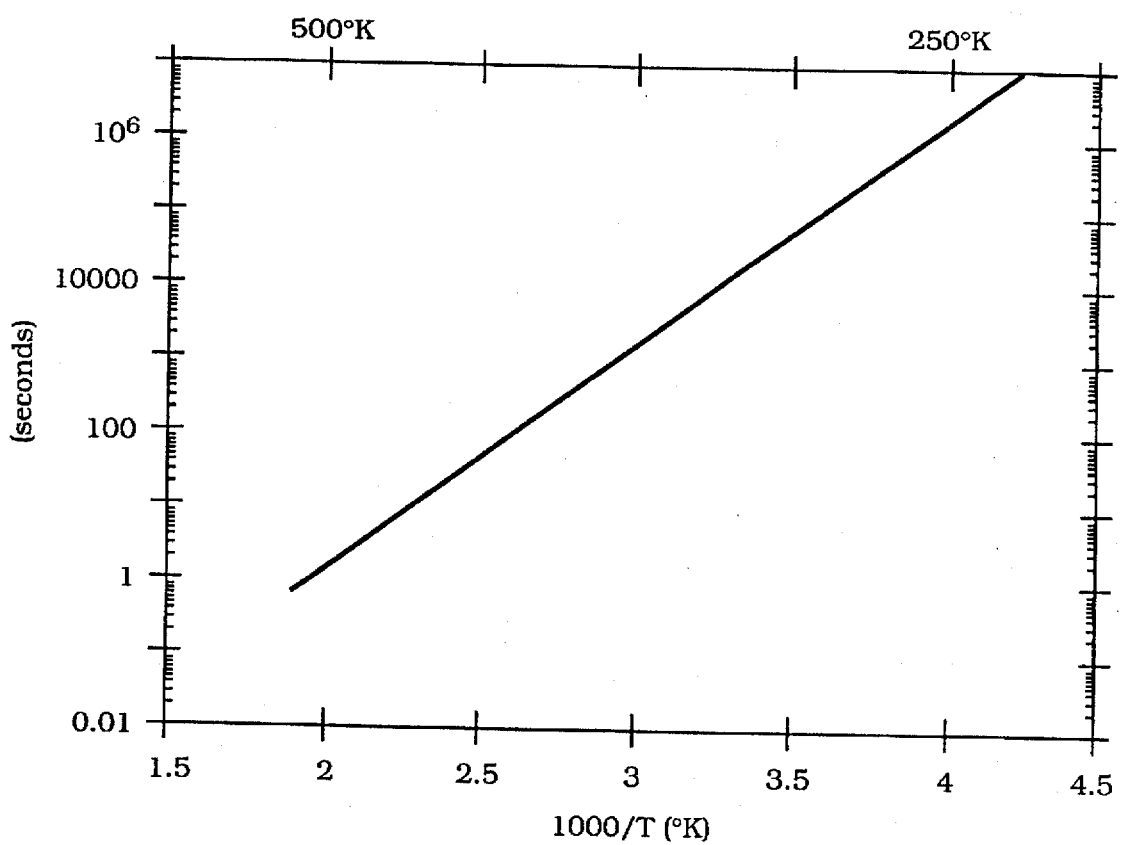
FIG. 2 is the half life change of ozone with temperature. The x-axis is 1000/T (° K) and the y-axis is the ozone half life in seconds.

The apparatus depicted in FIG. 1 was used to reparate the membranes of the examples. A model GL-1 ozone generator manufactured by PCI Ozone & Control Systems which utilizes a plasma discharge was used. Three weight percent ozone in air stream flowing at 0.2 SCFM (5,000 cc/min.) was produced. The stream was piped over a distance of approximately 250 yards to the point of the mass flow control. Mass flow to the CVD reaction zone was controlled by splitting the flowing ozone stream so that most of the stream is vented and about 100–300 cc/min are flowed into the reaction zone. The flow rate into the CVD reaction zone was dictated by the physical dimensions of the membrane holder and the desired residence time in the reaction zone. The desired residence time in the reaction zone is set by the desired reaction temperature and ozone lifetime at that temperature. The temperature dependence of the ozone lifetime in free space is shown in FIG. 2.

With one inch diameter membranes mounted in our membrane cell, the gas volume is less than 0.5 cc, which is significantly less than the ~2 cc volume of the preheat coil. This gives a residence time of 0.5 second when the flow is ~300 cc/min and a residence time of ~1.5 seconds when the gas flow is ~100 cc/min. These residence times are significantly less than the ozone lifetime even at temperatures as high as 200° C. By using these high gas flow velocities and short residence times, the entire membrane surface is homogeneously reparated.

The volatile silicon containing compound that is permeated from the opposite side of the membrane is introduced into an inert gas carrier stream which is flowed across the side of the membrane opposite to that on which the ozone is introduced. The velocity of the argon stream is set so that only a small fraction of the volatile silicon containing compound is consumed in the interfacial reaction with ozone. It is preferred that less than 20 percent of the volatile silicon containing compound be consumed in the reaction with ozone. By not depleting the supply of the silicon compound, the uniformity of the reparation is significantly improved.

The use of this interfacial gas phase reparation technique is illustrated for the reparation of three different types of membrane structures. The first example is a metallic filtration membrane, the second is an asymmetric ultrafiltration membrane, and the last example is the application of the reparation technique to a zeolite membrane.

EXAMPLE 1

Reparation and Pore Size Reduction of a Metal Microfiltration Membrane

Applying the interfacial gas phase reparation technology to a metallic membrane, we reduced the nominal pore size by a factor of four while significantly narrowing the pore size distribution. Metallic filtration membranes are available from a number of suppliers, and experiments were performed with a nominal 1 micron pore size porous stainless steel membrane purchased from Mott Inc. The as purchased membrane is a tortuous path filter where the filtration properties are controlled by necks in the pore structure between metal grains. Variations in the size of the powder (metal grains) used to form the membrane lead to a variation in the size of the pore structure in the membrane.

These variations in the controlling pore size distribution can be measured by a variety of techniques such as the distribution of bubbles formed on the membrane surface in a bubble point test. In this test water is flooded over one surface of the membrane and a gas pressure is applied from the opposite face of the membrane. As the gas pressure increases, isolated gas bubbles appear at the point of the largest pores. By physically examining the spatial distribution of bubbles as a function of pressure, the pore size distribution can be characterized. Another characterization of the pore size distribution is the membrane's ability to filter monodispersed polymer spheres suspended in water. Polymer spheres with less than 0.05 microns variation in particle size are commercially available. It is found that the as received Mott membrane will pass a small number of 2.5 microns spheres. The flux of spheres through the membrane steadily increases as the sphere size is decreased from 2.5 microns to 2.0 microns, to 1.5 microns to 1.2 microns to 1.0 microns. Below that size the sphere flux through the membrane gradually increases. From a combination of bubble point and sphere permeation experiments, the nominal pore size of the initial membrane is estimated to be ~1.0 microns with a pore size distribution that extends up to 2.5 microns with the centroid of the distribution being within 0.75 microns of 1 microns.

Figure 3:
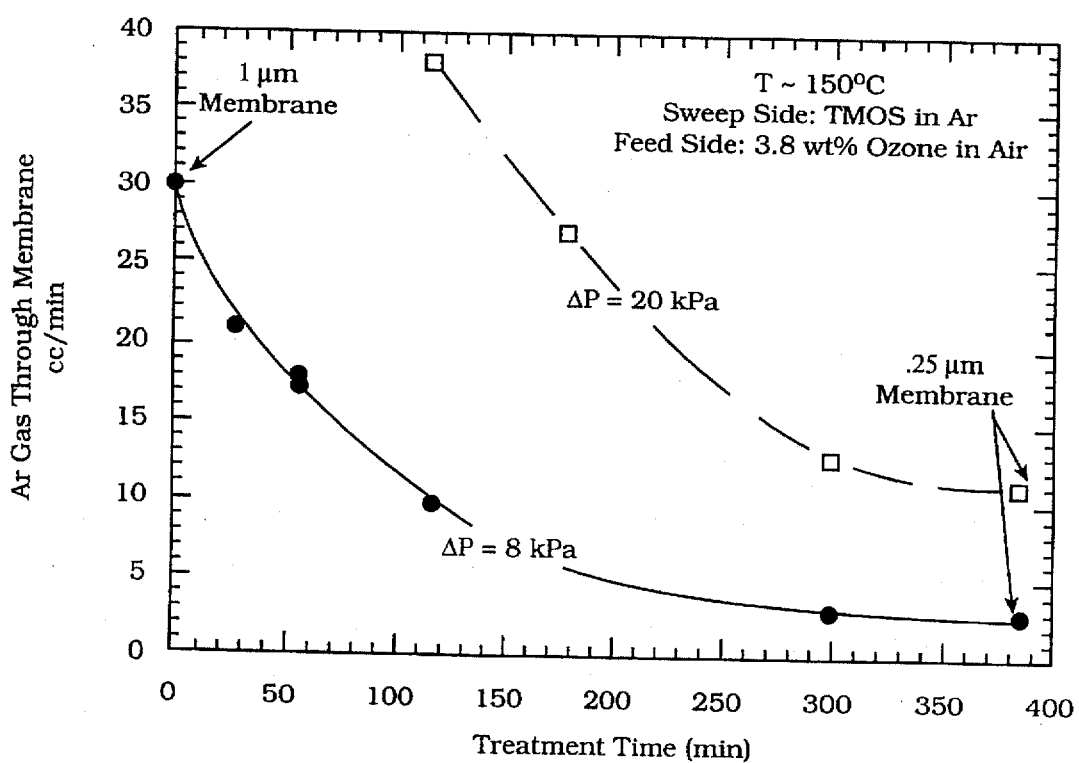
FIG. 3 is a graph of the interfacial pore size reduction of a nominal 1 µm Mott stainless steel membrane during the CVD method of the instant invention as well as that of a 0.25 µm membrane. The x-axis is treatment time in minutes and the y-axis is argon gas flow through the membrane in cc/min (flux). The treatment was conducted at 150° C.

To narrow and reduce the pore size distribution of the Mott membrane, it was interfacially reparated at 150° C. with a CVD process that used ozone and TMOS (tetramethylorthosilane). FIG. 3 shows how the argon gas flux through the membrane changed during the reparation process. The argon flux was measured with two different transmembrane gas pressures of 8 an 20 KPa.

Figure 4:
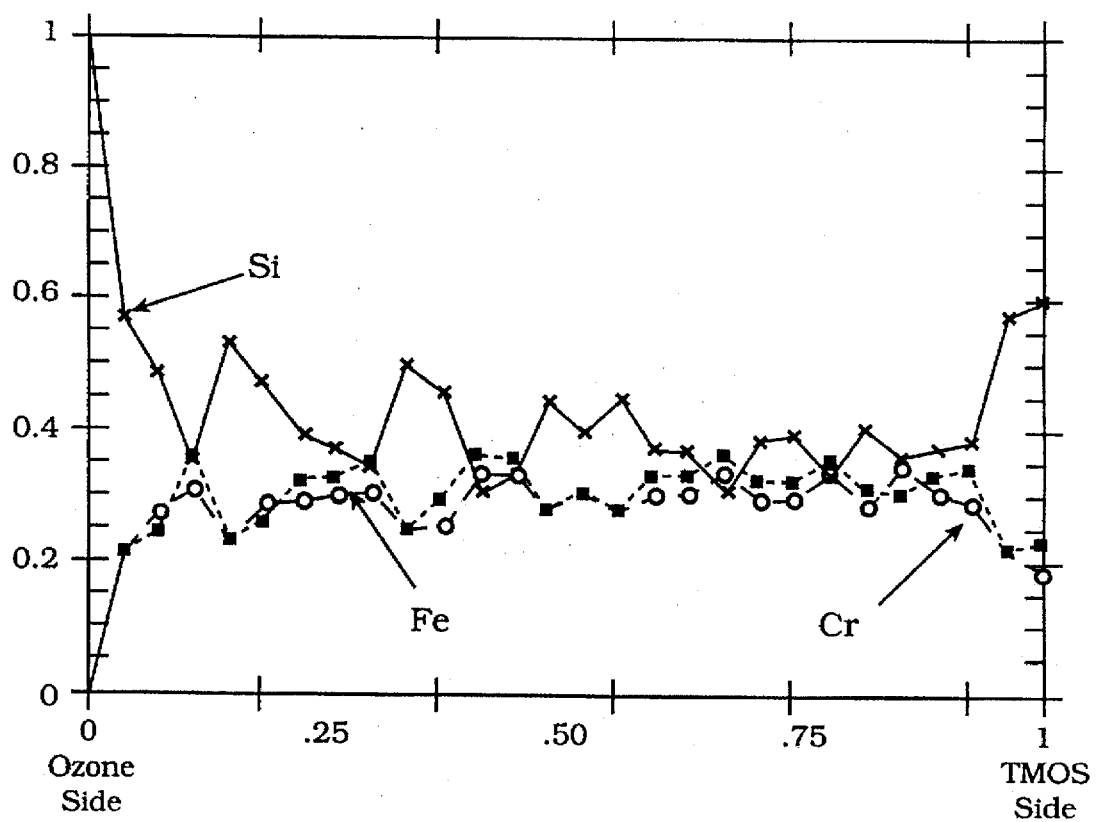
FIG. 4 depicts silica deposition across a porous metal membrane (Mott thickness=3 mm, nominal pore size ~/µm). The x-axis is the fraction of distance through the membrane and the y-axis is mole fraction. The silica source was TMOS, the reaction temperture was 150° C., the ozone concentration was 4% (in air) and the analysis was across a fractured surface.

At the end of the reparation procedure shown in FIG. 3, the average pore size and size distribution was measured. It was found that the pores were reduced to an average size of 0.25 microns and that the pore size distribution was within 0.05 microns of this nominal size. This reduction in pore size is clearly accompanied by a dramatic reduction in the pore size distribution. Such a narrowing of the pore size distribution can be accounted for by realizing that reactants are preferentially transported through larger pores of the membrane. Preferentially transporting reactants through large pore structures causes more coating to be deposited in the larger pore structures. This preferential coating of the larger pore structures is what reparates the membrane and narrows the pore size distribution. The preferential coating of the large pore structures occurs even though reaction is not much faster than diffusion. When reaction is not significantly faster than diffusion, the coating can deposit across the entire thickness of the membrane. The mass transfer across the membrane is set by the pore size, temperature, concentration gradient and pressure gradient across the membrane, while the reaction rate is set by the choice of reactant (TEOS, TMOS, etc.), and the temperature. The large micron sized pore structure of the Molt membrane sets up a large mass transfer and the coating deposits across the entire thickness of the membrane. This can be seen in FIG. 4 where a profile of the silica deposition across the Mott membrane used for the reparation experiment in FIG. 4 is shown.

EXAMPLE 2

Reparation and Pore Size Reduction of an Inorganic Ultrafiltration Membrane

Applying the interfacial gas phase reparation technology to an inorganic ultrafiltration membrane, we were able to selectively reparate defects and controllably alter the effective pore size. The inorganic ultrafiltration membranes used were produced using sol-gel chemistry. A schematic diagram of the membranes is shown in FIG. 5.

Figure 5:
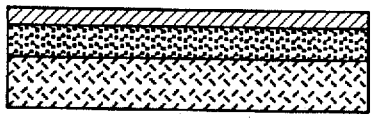
FIG. 5 is a schematic diagram of an asymmetric inorganic ultrafiltration membrane (cross-sectional view).
Figure 6:
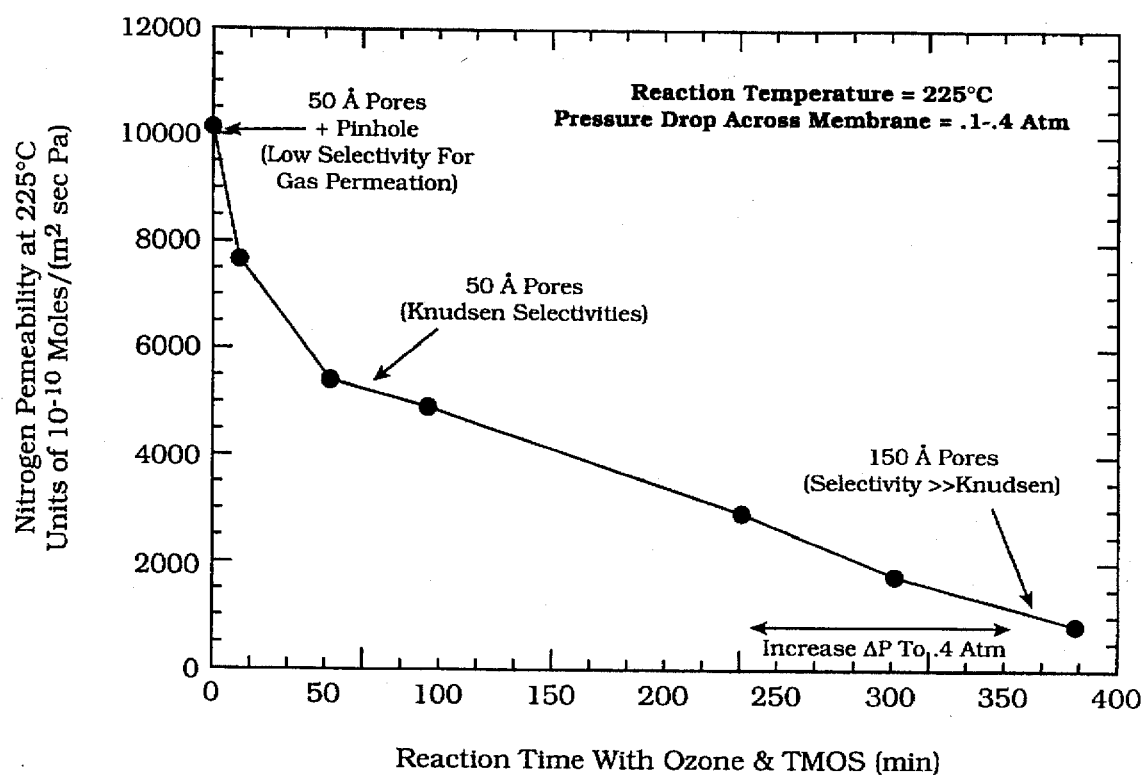
FIG. 6 is a depiction of the ability of the instant CVD process to reparate defects in membranes. The x-axis is reaction time with ozone and TMOS in minutes and the y-axis is nitrogen permeability at 225° C.

The permselective gamma-alumina layer on the surface of the membrane shown in FIG. 5 was produced using sol-gel chemistry. The sol-gel coating tends to have defects when it is applied over the large pore support. As such, a layer with intermediate pore size is incorporated into the membrane to reduce the defect density. Even with the use of an intermediate pore size layer defects can still exist in the sol-gel coating. The ozone assisted interfacial gas phase CVD process has been shown to seal these defects. An example of the ability of the interfacial ozone assisted CVD process to reparate defects in membranes is shown in FIG. 6. This Figure shows the permeability change during reparation of an asymmetric inorganic ultrafiltration membrane with defects in the sol-gel coating. During the initial stages of reparation, the defect in the coating is preferentially sealed. The fact that the defect is preferentially sealed is deduced by the relative changes in selectivity and permeability of the membrane. The initial membrane had a selectivity in single component gas permeation experiments below the Knudsen limit. In the initial phases of the reparation procedure, the permeation fell slightly and the membrane exhibited Knudsen like selectivities. Continuing the reparation process decreased the permeability of the membrane by reducing the average pore size in the permselective layer. At the end of the reparation procedure, the membrane pore size was characterized by permeation characteristics of oligomers. Narrow molecular weight polyethylene glycol oligomers dissolved in water were placed on one face of the membrane and their flux through the membrane was measured. It was found that the reparated membrane blocked the passage of oligomers with molecular weights as small as 400 g/mole. Sol-gel membranes with 40 Å pores will cut off permeation of polyethylene glycol oligomers with molecular weights above ~2,000 g/mole. From this experiment the pore size was estimated to be slightly above ~10 Å.

EXAMPLE 3

Reparation of a GEL/LAI/ISC Zeolite Membrane Using Silicone Oil As a Selectivity Enhancing Coating Precursor Zeolite layers can be produced on top of layers intermediate between the intergrown zeolite crystals and the support material of the membrane system. If zeolites are present in the permeable intermediate layer, they can be used to nucleate the growth of the uppermost zeolite layer. When the intermediate layer nucleates the growth of the zeolite layer in a hydrothermal synthesis process, the morphology of crystals in the zeolite layer can be columnar and a crystallographically preferred orientation may be observed.

When the intermediate layer contains mesoporous as well as colloidal zeolites, it is referred to as a growth enhancing layer (GEL). A growth enhancing (GEL) layer contains identifiable particles with interstices between said particles of colloidal zeolites, or colloidal zeolites and metal or silicon oxides, or colloidal zeolites and colloidal metal and mixtures thereof. The metal or silicon oxides which can be used herein are selected from the group consisting of colloidal alumina, colloidal silica, colloidal zirconia, colloidal titania and polymeric metal oxides prepared from sol-gel processing and mixtures thereof. Preferably colloidal alumina will be used. The colloidal metals which can be used include copper, platinum and silver. Said interstices in the GEL are mesoporous. In a preferred embodiment, said mesoporous interstices in the GEL have sizes of about 20 to about 2000 Å. Interstices in this size range provide a permeation path for molecules through the GEL layer.

Molecules can permeate through these interstices because they are devoid of any material which would hinder mass transport during membrane use. GEL layers nucleate the formation of the dense mat of zeolite crystals grown on the surfaces of these layers. This dense mat of crystals is closely packed together such that 99.9% of the grain boundary zones stretching between top and bottom of the columnar zeolite layer have at least one point along their length where the width does not exceed 20 Å.

As the zeolite layer grows from the interface at the GEL layer, crystal width may increase, however the individual crystals remain separated at their boundaries by at least one point of spacing of $\leq 20$ Å. This densely packed mat can have a columnar morphology. Zeolite membranes grown without the use of growth enhancing layers do not have the degree of perfection of such columnar membranes.

GEL layers contain colloidal-sized zeolites. Growth enhancing layers can be formed from a solution containing a nanocrystalline zeolite or a mixture of metal or silicon oxide and nanocrystalline zeolite or a mixture of colloidal zeolite and colloidal metal. Preferably, colloidal zeolite or a mixture of colloidal zeolite and metal or silicon oxide will be used to form the GEL layer. Nanocrystalline zeolites have sizes between 50 and 5,000 Å and form a stable dispersion or solution of discrete particles. In that process, a synthesis mixture is prepared by boiling an aqueous solution of a silica source and an organic structure directing agent in a proportion sufficient to cause substantially complete dissolution of the silica source. The silica source is advantageously colloidal silica or polymeric which is prepared by methods known in the art; see for example Brinker and Scherer, Sol-Gel Science, Academic Press, 1990. A preferred method for preparing polymeric silica is by the acid hydrolysis of tetraethyl orthosilicate and a preferred methd for preparing colloidal silica is by the base hydrolysis of tetraethyl orthosilicate. The organic structure directing agent, if used, is advantageously introduced into the synthesis mixture in the form of a base, specifically in the form of a hydroxide, or in the form of a salt, e.g., a halide, especially a bromide. The structure directing agent may be, for example, the hydroxide or salt of tetramethylammonium (TMA), tetraethylammonium (TEA), triethylmethylammonium (TEMA), tetrapropylammonium (TPA), tetrabutylammonium (TBA), tetrabutylphosphonium (TBP), trimethylbenzylammonium (TMBA), trimethylcetylammonium (TMCA), trimethylneopentylammonium (TNNA), triphenylbenzylphosphonium (TPBP), bispyrrolidinium (BP), ethylpyridinium (EP), diethylpiperidinium (DEPP) or a substituted azoniabicyclooctan-, e.g. methyl or ethyl substituted quinuclidine or 1,4-diazoniabicyclo-(2,2,2)octane. Preferred structure-directing agents are the hydroxides and halides of TMA, TEA, TPA and TBA.

The GEL layer can be formed from solutions containing the colloidal zeolites. For the GEL layer to be formed, it is preferable to calcine it at temperatures $\leq 1000°$ C., preferably from about 300°–600° C. When a GEL layer is formed, it is maintained in the final composition as a distinct layer having a thickness of about 0.1 to 20 μm, preferably about 1 to 5 μm. This layer contains interstices as described above.

By adjusting the ratio of colloidal zeolite and silicon oxide, the density of nucleation sites on the GEL can be controlled. This density controls the morphology of the zeolite film grown over the growth enhancing layer in a subsequent hydrothermal synthesis step. The higher the nucleation density, the narrower the zeolite-crystal-width the membrane will exhibit at the GEL columnar zeolite interface. Nucleation density can be controlled by the relative proportions of colloidal zeolites and metal or silicon oxides (with the density decreasing as the amount of the metal or silicon oxide utilized increases) as well as the size of the colloidal zeolites in the GEL. Colloidal sized zeolites in the range of from 50–10,000 Å are thus used in the GEL. The larger the colloidal zeolite crystals utilized in the GEL, the wider the zeolite columns in the membrane will be. Applicants believe that the addition of metal or silicon oxide, colloidal metal or mixtures thereof to the colloidal zeolite in the GEL layer provides spaces between nucleation sites allowing for control of the crystal width in the columnar zeolite layer.

GEL's containing pure metal or silicon oxides or colloidal metal fail to produce nucleation sites. A preferred formulation of GEL contains 100-x wt % of colloidal metal or metal or silicon oxide and x wt % of colloidal zeolite, where x is at least 0.01 when the GEL is not formed from pure colloidal zeolite. Hence, the nucleation density is set by the above formula as well as the size of the particles of colloidal zeolite, colloidal metal and metal or silicon oxide. The smaller the particle size of the colloidal zeolite particles, the denser the nucleation sites which produces narrower columnar zeolite crystal widths.

The hydrothermal treatment to form the crystalline zeolite layer is advantageously carried out by immersing the layer in a synthesis mixture, and heating for a time and at the temperature necessary to effect crystallization. Heating times may be, for example, in the range of from 1 hour to 10 days, advantageously from 24 hours to 4 days. Temperatures may be, for example, from 50° to 300° C., advantageously from 150° to 200° C. When a true zeolite material is formed, the synthesis mixture contains a source of silica, a structure directing agent, and a source of any other component desired in the resulting zeolite. It may also contain nanocrystalline zeolites or seed crystals.

Synthesis mixtures from which zeolite crystals are grown are well known in the art (see e.g., *Handbook of Molecular Sieves*, Rosemarie Szostak, Van Nostrand Reinhold, NY 1992). A preferred route for MFI zeolites is from a Low Alkaline synthesis mixture having a pH of about 8 to about 12 preferably about 9.5 to about 11, and from which MFI zeolite crystals can be grown. Such reaction mixtures are readily prepared by those skilled in the art. For example, suitable mixtures include $Na_2O$, TPABr, tetrapropylammoniumbromide, $SiO_2$ and water.

The membranes are grown by suspending the GEL coated porous substrate of choice in the low alkaline synthesis mixture. The synthesis mixture is then heated to about 50° to about 300° C., preferably about 180° C. for a period of about 30 minutes to about 300 hours, preferably for about 30 minutes. After crystallization, the supported layer may be washed, dried, and calcined in the normal way.

A preferred synthesis technique used with this invention is the growth of zeolite crystals on the face of a porous support or intermediate layer which is oriented from 90 to 270 degrees in a synthesis mixture. In the 180 degree orientation, the preferred orientation, surface on which the zeolite is to be grown is horizontal and facing downward, thus being referred to as inverted. Applicants believe this prevents zeolites which are homogeneously nucleated in the synthesis mixture from settling by gravitation and incorporating into the growing columnar zeolite layer. Thus, the zeolite layer is not perturbed during the growth process. We refer to this synthesis technique as an Inverted In Situ Crystallization (I-ISC) process. Growth on a GEL from a Low-Alkaline-synthesis solution using the I-ISC process is referred to as a GEL/LAI-ISC process or GEL/LAI-ISC membrane. For GEL/LAI-ISC membranes, the crystal width in the zeolite layer is between 0.1 and 20 μm.

Surprisingly, it has been found that when MFI membranes are grown by the LAI-ISC process, a degree of crystallographic orientation occurs. Much more significant crystallographic orientation occurs when MFI membrane are grown by the GEL-LAI-ISC process. Preferred orientation will be different depending on the zeolite grown, however, a preferred orientation will always be exhibited. When MFI zeolite membranes are grown using a I-ISC process from a Low Alkaline synthesis solution, the crystallographic orientation of the MFI zeolites is such that at least 75% of the crystals in the zeolite layer are aligned in the orientation (with the c-axis parallel to the growth direction within 15° preferably 5° of the normal to the surface of the zeolite layer), preferably at least 90% of the crystals will display the preferred orientation.

A measure of the proportion of the crystals that have the longest axis normal to the plane of the layer may be obtained by comparison of the X-ray diffraction pattern of the layer with that of a randomly oriented zeolite powder. In the case of an MFI-type zeolite, for example, the longest edge corresponding to the c axis, the ratio of the intensity of the 002-peak to the combined 200 and 020 peak is divided by the same ratio for randomly oriented powder; the quotient is termed the crystallographic preferred orientation (CPO). Measured in this way, layers in accordance with the invention have a CPO of at least 2, and may have a CPO higher than $10^5$.

Zeolite membranes fabricated using the above described GEL/LAI/ISC technique can have dense zeolite layers in which the zeolite crystals are intergrown such that non-selective permeation pathways in these as-synthesized films are non-existent. Absence of these non-selective pathways can be established using a Dye Test described below.

In this state, it would be expected that these continuous films of intergown zeolite crystals would effect selective separations of molecules. An example of an expected selective separaton is through molecular sieving mechanisms. Such separations are realized when specific molecules are sterically unrestricted by the zeolite pores (becoming permeate molecules) while larger molecules (retentate molecules) are rejected because of steric constraints. Thus the effective zeolite pore diameter becomes the controlling aperture of the selective permeation pathway. An example of such separations effected through molecular sieving would be the separation of para-xylene from a mixture of xylenes isomers utilizing an MFI-based zeolite membrane layer. The controlling pore aperture for the selective permeation pathway in the MFI system is larger than the kinetic diameter of para-xylene and smaller than the kinetic diameters of ortho-xylene and meta-xylene.

Contrary to expectations, the previously described zeolite membranes produced using the GEL-LAI-ISC technique, and having dense, intergrown, continuous zeolite layers exhibit a separation that is less than expected. This is very evident when the membranes with dense, intergrown, continuous zeolite layers are tested in molecular sieving. Generally expected separation performance can be estimated from independent measurements of the diffusivity of molecular species in the zeolites and the partition coefficient for molecules entering the zeolite form a molecular mixture being processed. Techniques to measure these quantities have been described J. Karger and D. Ruthven in "Diffusion In Zeolites And Other Microporous Solids" (John Wiley And Sons Inc. NY, 1992).

The applicants ascribe the less than ideal performance in separations applications for these as-synthesized zeolite membranes to physical changes which occur in the zeolite layer during separations testing or use. These physical changes in the zeolite layer which arises during use may be due to mechanical stresses and deformations which occur because of eposure of the membrane layer to elevated temperatures and pressures in the presence of hydrocarbon molecules. The applicants believe that stress or mechanical deformations in a layer of closely packed crystals may introduce defects or voids in the layer which can degrade the permselective properties of the membrane. Sepcifically the deformation or movement of one crystal will affect the neighboring crystals as well as the grain boundary separating the crystals.

Most of these dense intergrown zeolite memrbranes completely reject dye prior to testing (indicating continuous zeolite layers), then exhibit less than expected performance characteristics during use for high temperature molecular separations, and finally fail the dye test in post-testing evaluations by passing dye through the zeolite layer. Dense intergrown zeolite membranes which do not reject dye in testing prior to testing in separations typically have a small number of isolated defects.

It has been discovered that thin coatings applied to the zeolite layer can preserve or enhance the permselective properties of continuous, intergrown layers of zeolite crystals during separation applications. Certain coatings are capable of preventing the formation of defects and voids in the layer during high temperatrure use or testing which can lead to a loss of molecular selectivity in separation processes. When acting in a preventative sense, these coatings may serve to stabilize the separation between the intergrown zeolite crystals or 'cushion' crystals within the zeolite layer, alleviating or dispersing mechanical stresses and deformations arising from harsh process environments. These coatings can also serve a second purpose in that they can also act to seal defects in the zeolite layer, although, as described above, they can be advantageous when used in the absence of any defects or voids. It is critical to 'heal' defects and voids since they provide non-selective permeation pathways which result in poor separations performance. These two functions of stabilization and reparation of defects or voids in the membranes enhance the selectivity of the membrane, hence, we refer to the coating as a selectivity enhancing coating.

In order for coatings to be effective, they must be applied directly to the as-synthesized zeolite layer. The coating can be applied to either surface of the zeolite layer. In a preferred embodiment the coating is applied to the surface of the zeolite layer which is not in contact with the support or intermediate layer. Additionally, these coatings must interact with the zeolite layer without blocking or impeding molecular transport through pore openings of the zeolite layer. Interaction of the coating with the zeolite layer should be such that the coating does not block transport through more than four-fifths of the surface-exposed pore openings of the zeolite layer. In a preferred embodiment, interaction of the coating with the zeolite layer should be such that the coating does not block transport through more than one-half of the surface-exposed pore openings of the zeolite layer. An occlusion does not completely block the diffusion of molecules through the pores, but significantly hinders diffusion of the molecular species of intrest through the pore. As such occlusions increase the mass transfer resistance of the membrane.

In order to successfully perform as a coating layer with the previously mentioned characteristics, a coating must possess several other critical properties. First, the coating must be both stable at the application temperature of the membrane. Stability is taken to be both mechanical and chemical stability. The coating can change its physical characteristics within the first ~200 hours of use, after which the coating material should be stable. Secondly, the coating must adhere to the zeolite layer and should not impede molecular transport through a significant number of surface-exposed pores of the zeolite layer. This means that the coating layer precursor material must adhere to the zeolite without diffusing significantly into the pore structure of the zeolite crystallites, inhibiting transport of the desired molecular species through the zeolite.

For example many polymeric coating materials cannot be used (even though they are stable under process conditions and they adhere to the zeolite layer) because their precursor molecules have molecular sizes which permit their introduction into the zeolite pore system. As such, many polymeric coating materials inhibit transport of the desired molecules through the zeolite. It is possible, however, to choose polymeric coating precursor materials which are sterically incapable of entering the pores of the zeolite crystals. An example of such a coating layer precursor is Invoil 940 silicone diffusion pump fluid (Inland Vacuum Industries), a silica precursor.

For the membrane to have an adequate flux, the selectivity enhancing coating should increase the mass transfer resistance the membrane offers to molecules permeating through the zeolite layer by no more than a factor of five. In a preferred embodiment, the selectivity enhancing coating should increase the mass transfer resistance the membrane offers to molecules permeating through the zeolite layer by no more than a factor of two. The coating can increase the mass transfer resistance of the membrane offers to molecules permeating through the zeolite crystals by either occluding the zeolite pore structure, or covering the zeolite pore structure. Invariably some portion of the zeolite pore structure exposed on one of the sides of the zeolite layer is covered by the coating. The increase of mass transfer resistance due to the coverage of the zeolite pore structure is determined by the material used to form the selectivity enhancing coating.

The selectivity enhancing coating material can be a permeable or impermeable material, or a material which in some regions is permeable and in other regions impermeable. Permeability is taken to mean the ability to transport a molecule through the layers of the membrane at the application temperature. If the selectivity enhancing coating is made from a permeable material, the material can be coated over the entire surface of the memrbane.

If the material used for the selectivity enhancing coating is made from an impermeable material, it cannot completely cover and block the pore structure of the zeolite membrane.

Impermeable materials must be applied so that they cover only a fraction of the zeolite layer. Ideally an inpermeable coating must bridge the boundaries of enough zeolite crystals to prevent defects and voids from arising without blocking a significant fraction of the zeolite membrane. Preferably, this type of selectivity enhancing coating bridges boundries between at least 10% of the surface-exposed crystals in the zeolite layer and, more preferably, the coating bridges the boundaries between at least 50% of the surface-exposed crystals in the zeolite layer.

A third type of selectivity enhancing coating may combine the characteristics of the two previously described coating systems. It may be both permeable (to process molecules) in some regions of the layer and impermeable in other regions of the membrane An example of such a coating is thin silica film which when deposited on the surface of a zeolite nucleates and grows a porous film in some areas and a dense film in others. The applicants believe that such silica films can be deposited by interfacial ozone assisted CVD processes. In the bulk phase, silica is a dense impermeable material for the permeation of hydrocarbon molecules, however when deposited as a thin film, some regions of the film can be formed into pores or as isolated moelcular or nanoscale aggregates of the coating material on the surface of the zeolite layer. In the region of the zeolite layer covered by either pores in the silica film or isolated moelcular or nanoscale aggregates of the silica coating material, the coating is said to be porous. The porous region may occur at the edge of a dense region in the film.

Dye Testing Procedure Used To Characterize Zeolite Membranes

The absence of voids in the zeolite layer is reflected in the inability of large dye moleculres such as rhodamine B to permeate through the layer into the substrate. Permeation of dye through the zeolite layer can be detected by observing the way it soaks into the porous substrate. Dy permeating through the columnar zeolite layer will be wicked into the porous substrate in a manner similar to the way ink soalds into a piece of blotter paper. The presence of dye in the porous substrate is especially easy to detect when the substrate is made from a porous ceramic that does not absorb light. Light scattering in such porous substrates causes them to appear white when viewed with the naked eye.

Any dye which wicks into the substrate through a small pinhole in the membrane surface will be readily visible as a coloration change in the ceramic substrate. Dye molecules with sizes large than the zeolite pore structure will not transport into the underlying substrate except through defect sites. The rate at which the dye transports through a pinhole is different from the rate at which dye spreads over the underlying porous ceramic can be removed through the same pinhole in a subsequent washing step. Thus a simple way of detecting dye permeation into the porous substrate consists of applying a dye solution to the membrane surface and subsequent washing excess dye away to reveal pinholes in the membrane.

The test can be conducted with a soluble dye which has a physical size larger than the controlling aperture size of the zeolite. A preferred dye is Rhodamine B, which is a commonly used laser dye. A convenient solvent to make a solution of this dye is methanol, however other solvents such as toluene can also be used as long as they tend to wet (or wick into) the ceramic substrate. Water is not a recommended solvent for this test. This dye should be applied from a concentrated solution which has a coloration similar to that of commonly available red wines. This range of colorations can be obtained from solutions with Rhodamine B concentrations in the ragen of 0.05–5 wt %. With different concentrations, the amount of time required for the dye soaking through to the substrate to become visible changes. A preferred procedure for dye testing zeolite membranes formed on white porous ceramic substrates is;

1) Make 20 ml of a stock solution containing 0.5 wt % of Rhodamine B in methanol. This solution should be stored in a sealed bottle to prevent evaporation of the methanol.
2) From the stock dye solution remove 5 drops with an eye dropper and apply the dye dropwise to the center of the dry (120° C. for 30 minutes) membrane so that the surface is covered. Typically 2–3 drops are needed to cover the membrane surface. Each drop contains ~0.25 milligrams of dye. Do not let the dye wick over the edge of the membrane into the porous ceramic exposed at the rim of the membrane.
3) Let the dye covered membrane stand for ~30 seconds and then blot off the excess dye solution with a paper towel.
4) Apply methanol to a clean section of the paper towel and blot the surface again with the towel to remove more dye.
5) Rinse the disk surface with methanol for 10–30 seconds. A convenient way to do this is with a methanol wash bottle.
6) Visually examine the substrate for any red colorations.

EXAMPLE 4

Repartion Using Silicone Oil

Figure 7:
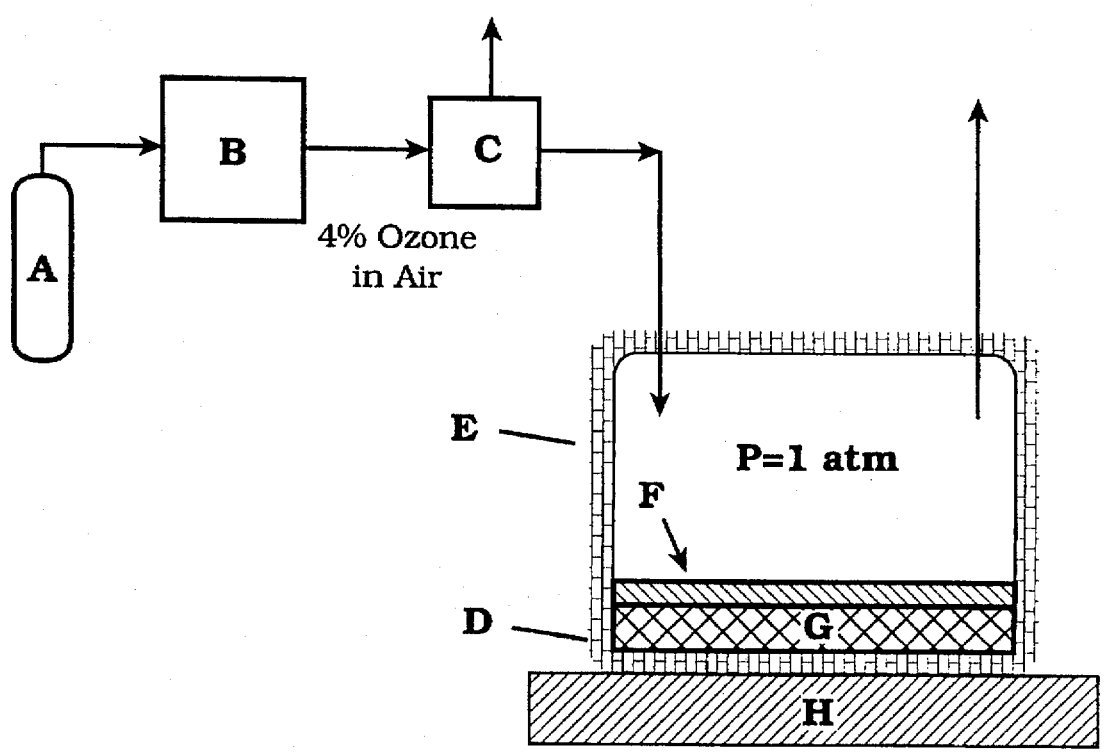
FIG. 7 is a diagram of the Cold Wall Reactor used for interfacial gas/liquid phase reparation of zeolite membranes. (A) is the air tank, (B) is the ozone generator, (C) is the mass flow controller, and (D) is the membrane holder. (E) is the Cold Wall Reaction Vessel, (F) is the zeolite layer, (G) is the membrane substrate, and (H) is the heating surface.

The apparatus depicted in FIG. 7 (Cold Wall Reactor which minimizes ozone degradation outside of the reaction zone) was used to apply selectivety enhancing coatings (SEC) to the membranes in the following examples. The Reactor eliminates the need for O-rings in the system and is amenable to large scale fabrication operations.

A model GL-1 ozone generator manufactured by PCI Ozone and Control Systems was used for the experiments. The instrument utilized a plasma discharge system to produce ozone (four weight percent in flowing air, 0.2 SCFM, 5000 cc/min). This stream was split by a mass flow controller so that ~100–300 cc/min reached the reaction zone. The residence time of the ozone in the reaction zone is governed by regulating the reactor temperature, since ozone has a specific half-life at given temperatures.

With a reactor volume of 50 cc, a reactor pressure of 1 atm, and temperature of 200° C., the residence time of ozone flowing at 300 cc/min was 10 seconds. The liquid phase oxidized by ozone to produce the silicon oxide SEC was Invoil 940 silicone diffusion pump fluid (Inland Vacuum Industries).

The use of this technique to produce SECs is illustrated for two different zeolite membrane systems. The first example involves application of a liquid SEC precursor to the front side of a GEL/LAI-ISC zeolite layer followed by ozone treatment in the Cold Wall Reactor. The second example illustrates the application of a liquid SEC precursor to the back side of a GEL/LAI-ISC zeolite layer followed by ozone treatment in the Cold Side Reactor.

A) Formation of an SEC from Front Side Treatment of a GEL/LAI-ISC Zeolite Membrane A GEL/LAI-ISC zeolite layer (supported by a porous A16 alumina support) was coated with a thin layer of Invoil 940 silicone diffusion pump fluid (Inland Vacuum Industries) applied by pouring the material directly on top of the zeolite layer. This oil was allowed to stand, in air, on the zeolite crystals, partly permeating into the intercrystalline defects and voids in addition to coating the surfaces of the zeolite crystals. After 5 minutes, any remaining silicone oil was removed from the ceramic by blotting with a towel.

The treated disk was inserted into the Cold Wall Reactor, the entire system placed on a heating plate (at room temperature), and the ozone/air mixture flowed over the surface. The temperature was then raised to 200° C. and held at these conditions for 0.1–4 hours. After ozone treatment, the membrane was cooled and washed with technical grade toluene (dram through the membrane).

The GEL-LAI ISC membranes were tested for xylenes separations with and without a selectivity enhancement coating. Membranes fabricated on 3 mm thick 1 inch diameter alpha-alumina supports (800 Å pore size) were mounted into a permeation cell and sealed with a graphite O-ring. The permeation cell was heated to temperatures between 150° C. and 300° C. while a mixture of xylene isomers flowed across the face of the membrane which had the zeolite layer. The flow rate of the xylene feed was 1 ml/minute. Across the opposite face of the membrane an argon sweep was flowed at rates between 100 and 400 cc/minute. Pressure of both the argon sweep and the xylene feed was fixed at 1 atmosphere (absolute). The maximum selectivity for separation of the para isomer from either the meta or othoxylene isomer was determined. Without a selectivity enhancement coating observed selectivities for separation of the xylene isomers by the GEL-LAI-ISC membranes was less than 1.75 (para/ortho or para/meta) at all temperatures tested. Typical selectivities were in the range between 1.0 and 1.4. Four GEL-LAI-ISC membranes were tested in this manner without a selectivity enhancement coating. Three GEL-LAI-ISC membranes were tested with the SEC coatings, and showed significantly higher selectivities for the separation of the xylene isomers. Three GEL-LAI-ISC membranes tested with selectivity enhancing coatings showed maximum selectivities in the range from 3.5 to 5. The average maximum selectivity was approximately 4.

B) Formation of a SEC from Back Side Treatment of a GEL/LAI-ISC Zeolite Membrane A GEL/LAI-ISC zeolite layer (supported by a porous A16 alumina support) was placed in Invoil 940 silicone diffusion pump fluid (Inland Vacuum Industries) such that the oil covered the back side of the disk, but did not contact the zeolite layer. The disk was allowed to stand, in air, in the oil, which permeated into the substrate by capillary action. The oil eventually permeated into the intercrystalline defects and voids in the zeolite layer. After 30 minutes, the disk was removed from the oil and any remaining silicone oil was removed from the ceramic by blotting with a towel.

The treated disk was inserted into the Cold Wall Reactor, the entire system placed on a heating surface (at room temperature), and the ozone/air mixture flowed over the surface. The temperature was then raised to 200° C. and held at these conditions for 0.1–4 hours. After ozone treatment, the membrane was cooled and washed with technical grade toluene (drawn through the membrane).

The GEL-LAI ISC membranes were tested for xylenes separations with and without a selectivity enhancement coating. Membranes fabricated on 3 mm thick 1 inch diameter alpha-alumina supports (800 Å pore size) were mounted into a permeation cell and sealed with a graphite O-ring. The permeation cell was heated to temperatures between 150° C. and 300° C. while a mixture of xylene isomers flowed across the face of the membrane which had the zeolite layer. The flow rate of the xylene feed was 1 ml/minute. Across the opposite face of the membrane an argon sweep was flowed at rates between 100 and 400 cc/minute. Pressure of both the argon sweep and the xylene feed was fixed at 1 atmosphere (absolute). Without a selectivity enhancement coating bserved selectivities for separation of the xylene isomers by the LAI-ISC membranes was less than 1.75 (para/ortho or para/meta) at all temperatures tested. Typical selectivities were in the range between 1.0 and 1.4. A total of five GEL-LAI-ISC membranes were tested in this manner without a selectivity enhancement coating. When a GEL-LAI-ISC membrane was tested with the SEC coating, it showed a maximum selectivity near 4.5.

Applying the interfacial gas phase reparation technology to a GEL/LAI-ISC zeolite membrane, we were able to impart a selectivity for the separation of xylene isomers. Through interfacial gas phase CVD we were able to make a selective zeolite membrane. Without the gas phase reparation, the as-synthesized membranes were completely nonselective for the separation of xylene isomers. By reparation, a zeolite membrane at 150° C. for 1.5 hours a selectivity of 1.5 at 200° C. was imparted for the separation of para- from either meta- or ortho-xylene. In these experiments, a rubber O-ring was used to seal the membrane in the holder. It is believed that a portion of the region of the membrane under the o-ring that was not reparated became exposed in this experiment and limited the performance of the final zeolite membrane. The use of a graphite O-ring should alleviate this problem.

What is claimed is:

1. A method for enhancing and stabilizing the permselective properties, selectively sealing defects and pinholes, and controllably altering the pore size of porous membranes capable of passing ozone and silicon compounds, the method comprising the steps of:

contacting a porous membrane with a silicon compound wherein the silicon compound is coated on or impregnated in the porous membrane, and then reacting the silicon compound coated on or impregnated in the porous membrane with ozone for a time and at a reaction temperature and pressure sufficient to allow said ozone and the silicon compound to form a silicon oxide at the porous membrane's surface, wherein the silicon compound is a nonvolatile liquid having a vapor pressure less than 50 torr and a viscosity less than 1,000 centistokes at the reaction temperature.

2. A method according to claim 1 wherein said temperature is about 20° C. to about 300° C.

3. A method according to claim 1 wherein said porous membrane is selected from the group consisting of zeolite membranes, ceramic ultrafiltration membranes, solgel membranes, polymer membranes, metal membranes, porous substrates and mixtures thereof.

4. A method according to claim 1 wherein said silicon compound is silicon oil.

5. A method according to claim 3 wherein when said article is a zeolite membrane, said process additionally stabilizes said zeolite membrane to preserve the membrane's permselective properties and to allow said membrane to be utilized at temperatures of from about 50° C. to 750° C.

6. A method according to claim 3 wherein when and said membrane is a polymer membrane said membrane is stable at temperatures of about 20° to about 300° C. and said membrane does not degrade when exposed to ozone.

7. A method according to claim 1 wherein said ozone has a concentration of about 0.05 to about 50 volume %.

8. A method according to claim 6 wherein said temperature ranges from 200° C. to 300° C. when the lifetime of ozone ranges from 10 milliseconds to 1,000 milliseconds and wherein said temperature is less than 200° C. when the lifetime of ozone is 1,000 milliseconds or more.

9. A method according to claim 1 wherein said silicon compound is contained in silicon fluid or diffusion pump fluid.

* * * * *